United States Patent [19]
Tsukiji

[11] Patent Number: 5,834,808
[45] Date of Patent: Nov. 10, 1998

[54] NON-VOLATILE SEMICONDUCTOR MEMORY DEVICE

[75] Inventor: Masaru Tsukiji, Tokyo, Japan

[73] Assignee: NEC Corporation, Tokyo, Japan

[21] Appl. No.: 719,984

[22] Filed: Sep. 24, 1996

[30] Foreign Application Priority Data

Oct. 16, 1995 [JP] Japan .................................. 7-267175

[51] Int. Cl.⁶ .......................... H01L 29/76; H01L 29/788
[52] U.S. Cl. ........................................... 257/315; 438/217
[58] Field of Search ..................................... 257/314–316

[56] References Cited

U.S. PATENT DOCUMENTS

| | | | |
|---|---|---|---|
| 4,888,734 | 12/1989 | Lee et al. .................................. | 365/185 |
| 4,893,273 | 1/1990 | Usami ..................................... | 257/315 |
| 5,070,378 | 12/1991 | Yamagata ................................ | 257/315 |
| 5,364,806 | 11/1994 | Ma et al. .................................. | 437/43 |

FOREIGN PATENT DOCUMENTS 5-226662  9/1993  Japan ..................... 257/315

OTHER PUBLICATIONS

M. Bauer et al., "A Multilevel–Cell 32Mb Flash Memory", *1995 IEEE International Solid–State Circuits Conference*, 1995, pp. 132–133.

*Primary Examiner*—Olik Chaudhuri
*Assistant Examiner*—Howard Weiss
*Attorney, Agent, or Firm*—Sughrue, Mion, Zinn, Macpeak & Seas, PLLC

[57] ABSTRACT

The object of the present invention is to provide a non-volatile semiconductor memory device which is capable of increasing a integration density of a memory cell by increasing the number of states to be expressed with one memory cell.

A non-volatile semiconductor memory device of the present invention has a structure in which two floating gates (3, 4) under one control gate (5) having a minimum dimension are provided, each of two floating gates is able to express two values in accordance with existences of stored charges whereby one memory cell is able to express four values.

10 Claims, 18 Drawing Sheets

NON-VOLATILE SEMICONDUCTOR MEMORY DEVICE

BACKGROUND OF THE INVENTION

1. Field of the Invention

The present invention relates to a non-volatile semiconductor memory device, particularly to a floating gate type non-volatile semiconductor memory device.

2. Description of the Related Art

FIG. 1(a) is a plan view showing a constitution of a conventional non-volatile semiconductor memory device, FIG. 1(b) is an enlarged section view taken along the line X—X in FIG. 1(a), and FIG. 1(c) is an enlarged section view taken along the line Y—Y in FIG. 1(a), respectively.

As a non-volatile semiconductor memory device which is capable of writing and erasing data, an Electrically Erasable Programmable ROM (FLASH MEMORY (hereinafter, referred to as an EPROM) has been heretofore known, which is a field effect transistor wherein a first gate insulating film is arranged on a channel region formed between source and drain regions on a surface of a semiconductor substrate, and a control gate capacitively coupled to a floating gate via a second gate insulating film is formed thereon.

This conventional semiconductor memory device stores the difference between threshold voltages in accordance with the difference between charge storage states in the floating gate in the form of "0" and "1" of data.

As shown in FIGS. 1(a), (b), and (c) source and drain regions 1 and 2 are formed on a surface of a P-type semiconductor substrate 7, and a first insulating film 8, a floating gate 51, a second insulating film 9, and a control gate 5 are sequentially formed on a channel region formed between the source and drain regions 1 and 2. An element is electrically isolated from other adjacent elements by the second insulating film 9 serving as a field oxide film. A polycrystalline silicon to which phosphorus is introduced is ordinarily used as the floating gate 51. In this embodiment, cells adjacent to each other in the vertical direction share the source and drain regions 1 and 2, as shown in FIG. 1(a), and they use the source and drain regions 1 and 2 also as wirings. The source and drain regions 1 and 2 are separated from the floating gate 51 by a fourth insulating film 13.

In order to increase an integration density in such floating gate type non-volatile semiconductor memory device, reductions in a gate length of the floating gate and an interval between memory cells have been intended. Furthermore, to achieve this object, an exposing to form the floating gate has been carried out using a reduction projection exposing apparatus.

Even when the exposing is carried out by the above mentioned reduction projection exposing apparatus, however, since there is a limitation to the reduction of the gate length of the floating gate and the interval between the memory cells because of the inherent limitation due to a resolution of the reduction exposing projection apparatus, there is a limitation to the increase in the integration density of the floating gate type non-volatile semiconductor memory device. Therefore, there is a minimum dimension determined by the limitation to the resolution of such reduction exposing projection apparatus.

The memory cell, adjacent to another memory cell along the direction perpendicular to the axis connecting the source and drain regions, is separated from the other memory cells by a distance determined the minimum dimension described.

To express two states "0" and "1" of data, the width of the memory cell and the width of the separation region between the memory cells are necessary and each memory cells and separation region must be more than the minimum dimension. For this reason, the memory structure expressing two data states "0" and "1", covers a width twice the minimum dimension, when viewed along the line perpendicular to the axis connecting the source and drain regions.

SUMMARY OF THE INVENTION

As long as the foregoing memory structure is used, however, the integration density of the memory device is limited by the minimum dimension determined by manufacturing processes so that it is impossible to respond to requirements for higher integration density.

The object of the present invention is to provide a non-volatile semiconductor memory device having the structure which reduces the occupied area per the foregoing two states and increases the integration density of the semiconductor memory device.

To solve the foregoing subjects, in a non-volatile semiconductor memory device which comprises a semiconductor substrate having a major surface of P type; source and drain regions of N type formed in the major surface of the semiconductor substrate; a channel region formed between the source and drain regions; and a first insulating film, a floating gate, a second insulating film, and a control gate sequentially formed on the channel region, the improvement lies in the floating gate which consists of first and second floating gates. The under surfaces of the first and second floating gates contact the first insulating film and the upper surfaces of the first and second floating gates contact the second insulating film.

Furthermore, it should be desirable that a third insulating film, electrically separates the first and second floating gates, and the third insulating film is located so that each of channels is able to connect electrically between the source and drain regions, each of the channels located on each surface of the semiconductor substrate below the first floating gate and the second floating gate.

To achieve the foregoing object, in the non-volatile semiconductor memory device of the present invention, one memory cell has two floating gates, and one controls gate control these two floating gates. Each of the two floating gates is able to express the two states according to the existences of stored charges so that one memory cell can express four states. The two floating gates are separated by an insulating film, and a sufficiently thin insulating film to insulate the two floating gates in accordance with a minimum dimension determined by manufacturing process conditions. Since the width of the control gate and the interval between the adjacent memory cells can be reduced to the minimum dimension, one memory cell covers an area twice the minimum dimension. This fact proves that the non-volatile semiconductor memory cell of the present invention covers the area twice the minimum dimension to store the four values. Thus, the non-volatile semiconductor memory device of the present invention can obtain an integration density twice the maximum integration density of the conventional memory cell.

In the non-volatile semiconductor memory device of the present invention, each of the two floating gates is able to express two states in accordance with the existence of stored charges in each of the floating gates. In order that the two floating gates are controlled with one control gate, four states are stored by one memory cell, and these four states are read out, the non-volatile semiconductor memory device of the present invention adopts the following structure and the following operation method.

Data writing is carried out using a channel hot electron method. In this method, when a positive voltage is applied to either the drain region or the source region, and the gate, a region of a high electric field is produced near either the drain region or the source region. Among the accelerated electrons in this area, electrons which have sufficient energy (hot electrons) exceed a potential barrier of the tunnel film, and are injected to the floating gate. In order to produce the high electric field near either the drain region or the source region and to inject the hot electrons to the floating gate with a high effectiveness, a p$^+$ region having an impurity concentration higher than another channel region is formed.

In the non-volatile semiconductor memory device of the present invention, the writing operation requires that injections of charges to the first and second floating gates must be performed independently from each other. For this reason, regions having higher impurity concentrations than the channel regions are formed in the area where the channel region under the first floating gate contacts with the drain region, as well as in the area where the channel region under the second floating gate contacts with the source region. When electrons are injected to the first floating gate, a positive voltage is applied to the control gate and the drain region and the source region is grounded. At this time, since the p$^+$ region is formed near the drain region under the first floating gate so that hot electrons are produced with a good effectiveness, a large quantity of electrons are injected to the first floating gate. On the other hand, since the p$^+$ region does not exist near the drain region under the second floating gate, the production effectiveness of the hot electrons is low so that the electrons are not injected to the floating gate. Thus, the electrons can be injected only to the first floating gate. Similarly to this, in order to inject the electrons only to the second floating gate, it is necessary that a positive voltage is applied to the gate and the source region and that the drain region is grounded, thus electrons having high energy are produced in the region under the second floating gate where the p$^+$ region exists.

In reading out of memory contents, a positive voltage is applied to the gate and the drain region, and a current flowing between the drain and source regions is measured. Then, the quantity of the measured current is judged as a writing data.

When the charges as the electrons are injected to the first floating gate, the current quantity flowing through the channel under the first floating gate (channel I) is called $I_{1H}$, and when no charges are injected thereto, the current flowing through the channel 1 is called $I_{1L}$;

When the charges are injected to the second floating gate, the current flowing through the channel (channel 2) under the second floating gate is called $I_{2H}$, and when no charges are injected thereto, the current flowing through the channel 2 is called $I_{2L}$.

The quantity of the current flowing through the whole of the channels at the data reading operation is the sum of the quantities of the currents flowing through the channel 1 and the channel 2. The quantity of the currents can be the following four values by the combination of the existence of the charge injection to the first and second floating gates. Specifically, there are four kinds of the total current quantities $I_{1H}+I_{2H}$, $I_{1L}+I_{2H}$, $I_{1H}+I_{2L}$, and $I_{1L}+I_{2L}$.

However, at this time, it is assumed that the structures of portions above the first and second floating gates 1 and 2, namely, thicknesses of the second insulating films are equal, that the structure of portions below the first and second floating gates 1 and 2, namely, thicknesses of the first insulating films, widths of the channels 1 and 2, impurity concentrations of the channels 1 and 2, and impurity concentrations of the p$^+$ regions formed in the channels 1 and 2 are equal, and that electron injection conditions to the first and second floating gates, namely, writing bias conditions and writing times, are equal, an equation $I_{1H}+I_{2H}=I_{1L}+I_{2L}$ is satisfied. The values $I_{1L}+I_{2L}$ and $I_{1H}+I_{2L}$ become equal among the above described four values of the drain currents at the data reading out, and only four kinds of currents flowing during the reading out operation can exist. It is necessary to differentiate at least one value among the above mentioned structures and writing conditions, relating to the floating gates 1 and 2.

As described above, the floating gate type non-volatile semiconductor memory device of the present invention comprises the two floating gates below the control gate having the minimum dimension, each of the floating gates expressing two states as to it charge storage. Hence, the floating gate type non-volatile semiconductor memory device of the present invention can achieve the integration density twice that of the conventional semiconductor memory device.

The above and object, features, and advantages of the present invention will become apparent from the following description based on the accompanying drawings which illustrate an example of preferred embodiments of the present invention.

BRIEF DESCRIPTION OF THE DRAWINGS

FIG. 3(a) shows a bias condition in case of injection of electrons to a first floating gate, and FIG. 3(b) shows a bias conditions in case of injection of electrons to a second floating gate;

FIG. 4(a) is the graph concerning the first floating gate, FIG. 4(b) is the graph concerning the second floating gate, and FIG. 4(c) is the graph showing the relation between the total current flowing through the channels below the first and second floating gates and the total electrons stored in the first and second floating gates;

FIG. 18(a) is the graph concerning a first floating gate, and FIG. 18(b) is the graph concerning a second floating gate.

DETAILED DESCRIPTION OF THE PREFERRED EMBODIMENTS

Figure 1:
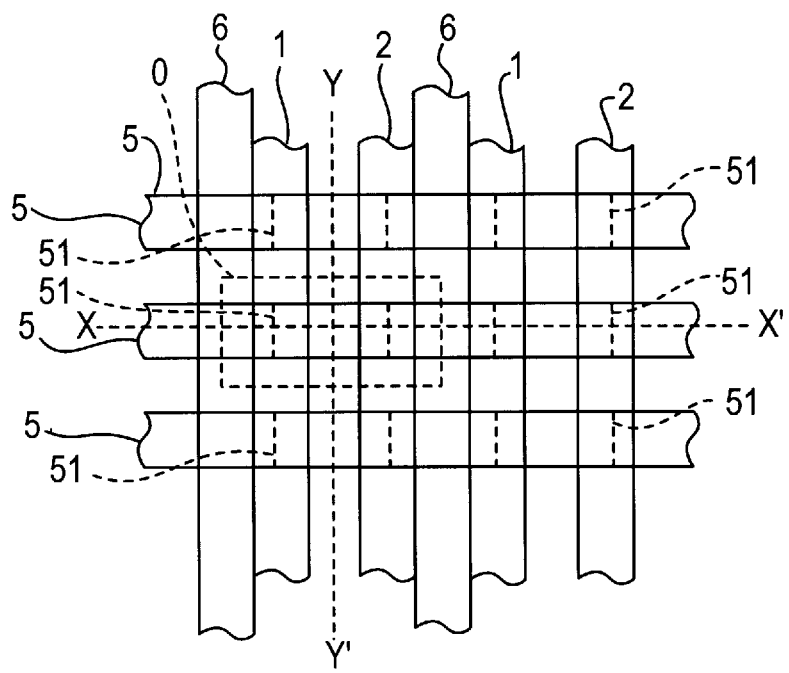
FIG. 1(a) is a plan view for explaining a structure of a conventional non-volatile semiconductor memory device.
FIG. 1(b) is a cross section taken along the line X–X' of FIG. 1(a)
FIG. 1(c) is a cross section taken along the line Y–Y' of FIG. 1 (a)
Figure 1:
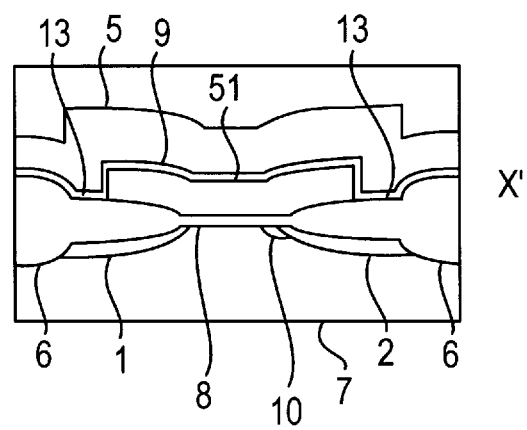
Figure 1:
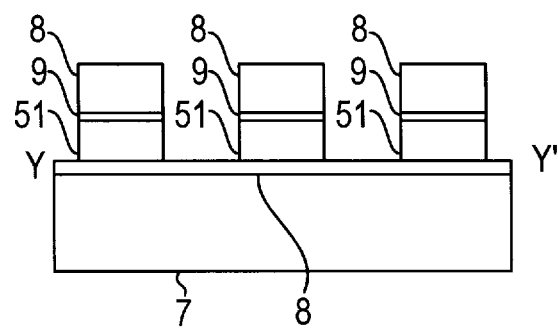

Next, an embodiment of the present invention will be described with reference to the accompanying drawings.

Referring to FIG. 2(a), source 1 and drain 2 are arranged so as to be perpendicular to a control gate 5. Memory cells vertically arranged in parallel share the source 1 and the drain 2. The source 1 and the drain 2 serve as a wiring which connects the source 1 and the drain 2 to other source 1 and drain 2 in adjacent memory cells arranged vertically in parallel.

Referring to FIG. 2(b), a first insulating film 8, a first floating gate 3, a second insulating film 9, and a control gate 5 are formed on a channel region of a P type semiconductor substrate 7. A third insulating film 13 exists on a surface of the source 1 and the drain 2, and it separates electrically the control gate from the source 1 and the drain 2. A $p^+$ region 10 is formed at the position where a first channel below a second floating gate 4 contacts with the drain 2.

A memory cell shown in FIG. 2(c) has basically the same structure as that of FIG. 2(b) except that a second floating gate 4 is formed on the first insulating film and a $p^+$ region 11 is formed at the position where a second channel below the second floating gate 4 contacts with the source 1.

Referring to FIG. 2(d), the first and second floating gates 3 and 4 are separated electrically from each other by a fourth insulating film 12.

Figure 3A:
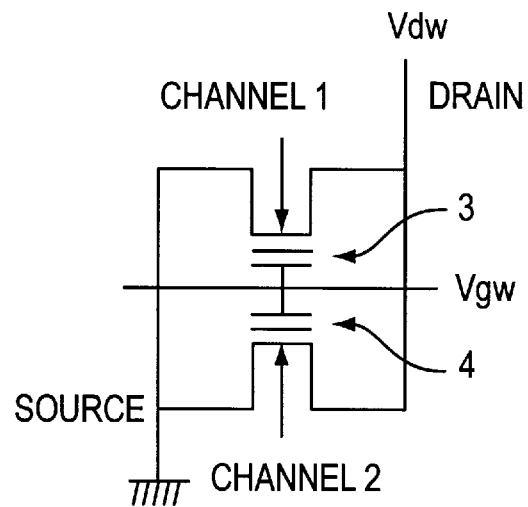
FIG. 3(a) and FIG. 3(b) are equivalent circuits of the structure of this embodiment.
Figure 3B:
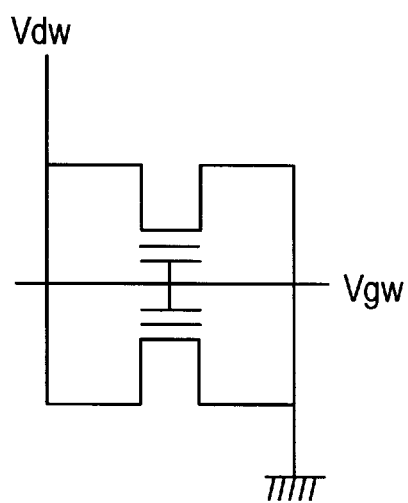

Referring to FIGS. 3(a) and 3(b), equivalent circuits of the structure of the present invention are illustrated as those wherein a source, a drain, and a control gate of two non-volatile memory devices having a floating gate are connected in parallel. An operation condition of the embodiment will be described using these equivalent circuits.

First, a writing operation will be described. In the memory device of the present invention, one memory cell expresses four data states by utilizing the combinations of existences of electron injections to the first floating gate 3 and of existences of electron injection to the second floating gate 4. The electron injections to each of the floating gates are conducted sequentially, not at the same time.

FIG. 3(a) shows a bias condition when electrons are injected to the second floating gate 4. It has been known that hot electrons can be produced with a good effectiveness by making the drain voltage almost twice the gate voltage. According to this fact, for example, a voltage of 5V is applied to the drain, a voltage of 2.5V is applied to the gate, and the source is grounded. At this time, a high electric field region is produced at the position where the drain below the first floating gate contacts with the $p^+$ region, and a great quantity of hot electrons are generated. Electrons having sufficient energy enough to exceed an energy barrier of the first insulating film are injected to the first floating gate. Because of lack of the existence of a $p^+$ region near the drain 2 below the second floating gate, a high electric field region is not produced so that electrons are not injected to the second floating gate.

FIG. 3(b) shows a bias condition when the electrons are injected to the second floating gate. In this case, a high electric field region is produced between the $p^+$ region below the second floating gate and the source so that electrons are injected only to the second floating gate.

A writing operation of data to one memory cell is performed in such manner that after the data writing to the first floating gate, the data writing to the second floating gate is carried out. Specifically, the data writing operations are carried out twice, whereby the data writings for expressing the four states can be performed. Thus, the time required to perform twice data writings is not different from that of the conventional non-volatile memory. Furthermore, any of the electron injections to the first and second floating gates may be carried out prior to the other electron injection.

Figure 4A:
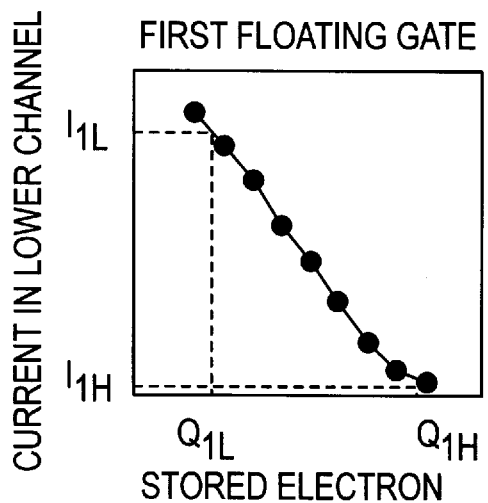
FIG. 4(a), FIG. 4(b), and FIG. 4(c) are graphs showing relations between electrons stored in a control gate and a current flowing through each of channels.
Figure 4B:
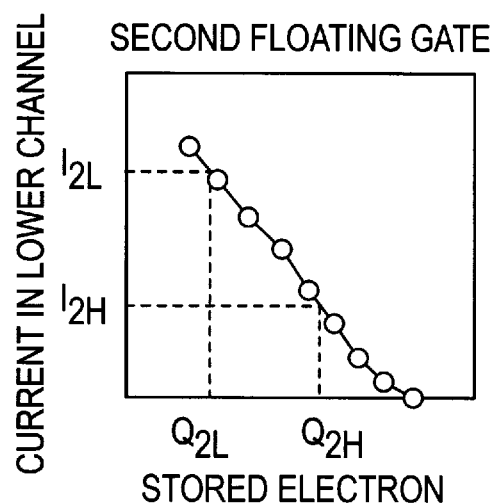

Next, a reading out operation of the written data will be described. In the reading out operation, a positive voltage is applied to the gate and the drain, and the states of the written data are judged in accordance with the current flowing through the drain. A voltage as low as, for example, about 1 V is used as the drain voltage so that the electrons are not injected to the floating gate during the reading out operation. When the bias at each of terminals of the memory cell is fixed, the relation between the injected electrons to the first floating gate and the drain current flowing through the first channel below the first floating gate is shown in FIG. 4(a), and the relation between the injected electrons to the second floating gate and the drain current flowing through the second channel below the second floating gate is shown in FIG. 4(b). In this case, the control gate voltage is set at 3 V; the drain voltage, 1 V; and the source voltage and the substrate voltage, a ground voltage. FIG. 4(a) shows the relation between the quantity of the electrons stored in the first floating gate and the current flowing through the channel below the first floating gate. When this measurement work is made, the sufficient quantity of the electrons are injected to the second floating gate in order that no current flows through the channel below the second floating gate with the gate voltage used in the measurement. FIG. 4(b) shows the relation between the quantity of the electrons stored in the second floating gate and the current flowing through the channel below the second floating gate. When this measurement is made, the sufficient quantity of the electrons are injected to the first floating gate in order that no current flows through the channel below the first floating gate with the gate voltage used in the measurement.

Figure 4C:
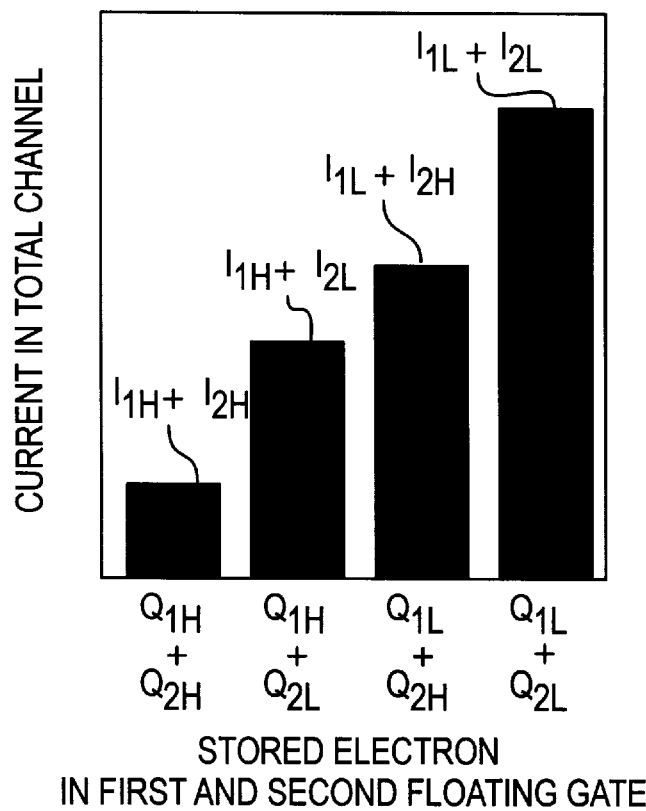
Figure 5A:
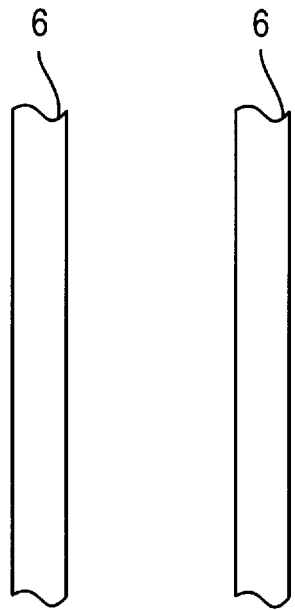
FIGS. 5(a)–(d), 6 (a)–(d), and 7 (a)–(b) are plan views for explaining sequentially each of steps of a manufacturing method of the embodiment (FIG. 2(a))
Figure 5C:
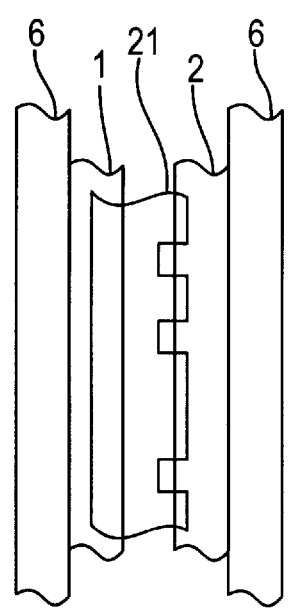
Figure 5B:
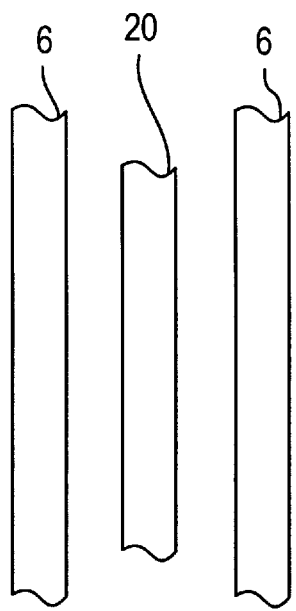
Figure 5D:
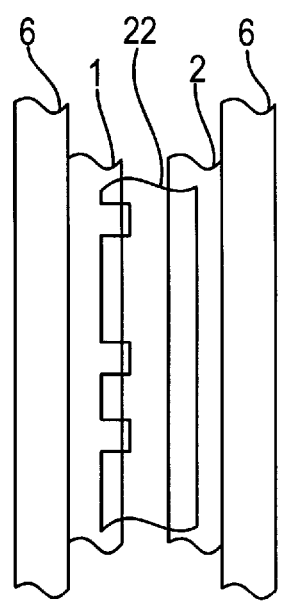
Figure 6:
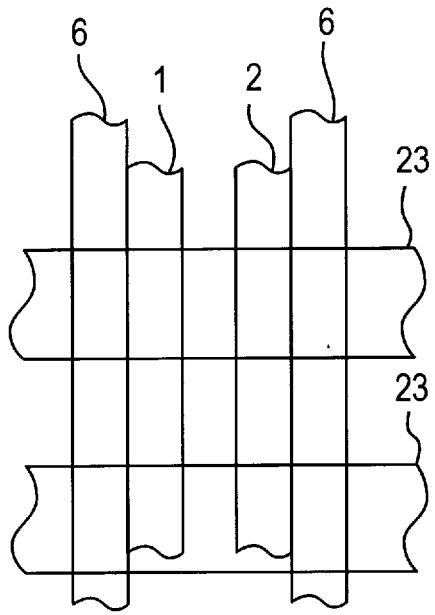
Figure 6:
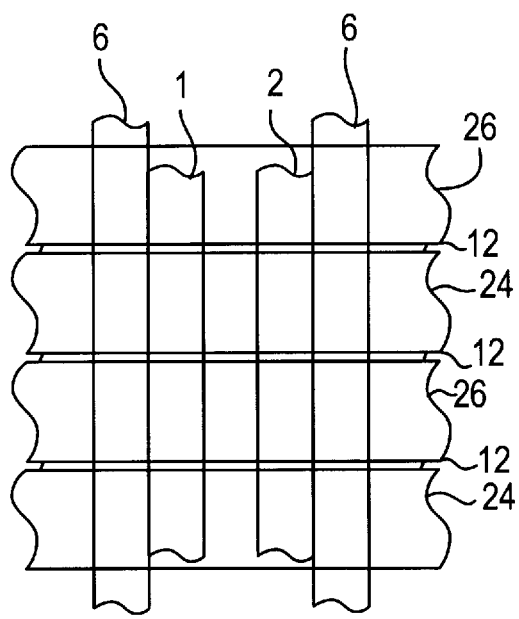
Figure 6:
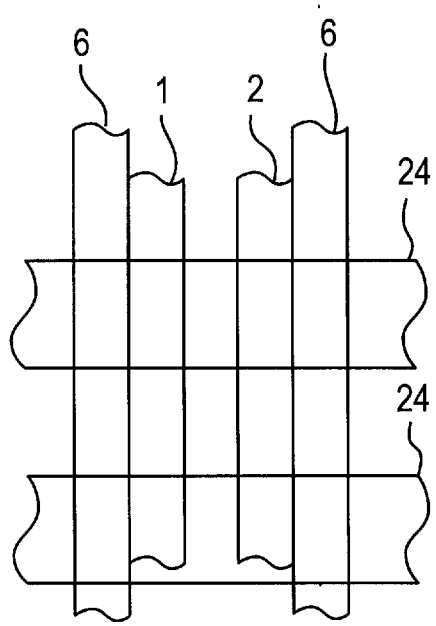
Figure 6:
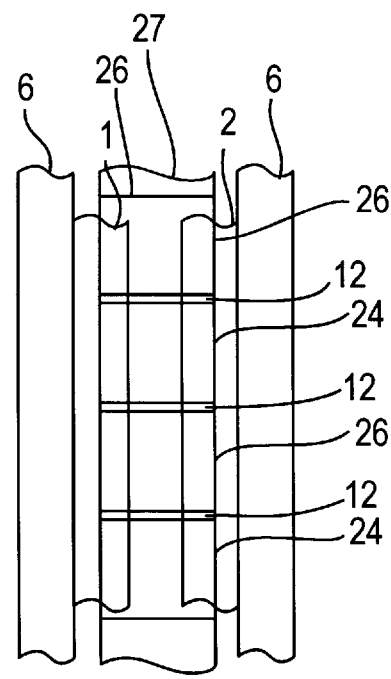
Figure 7:
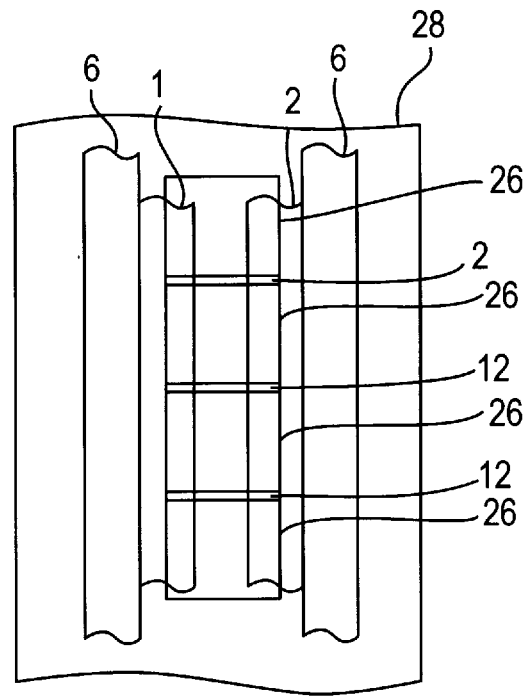
Figure 7:
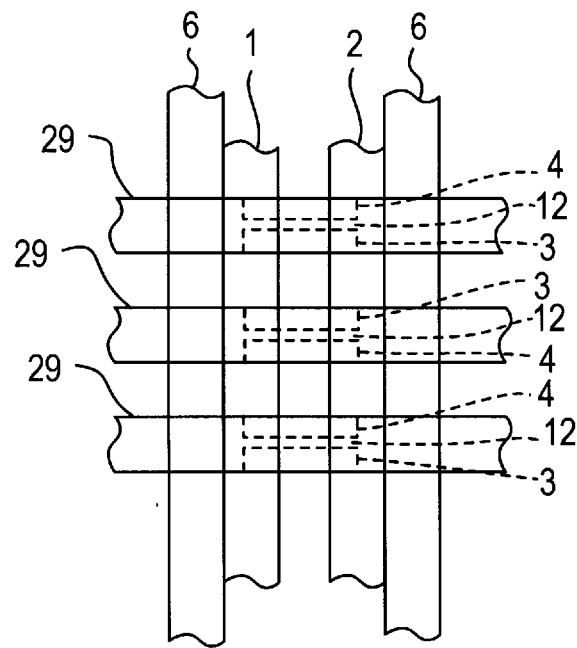
Figure 8A:
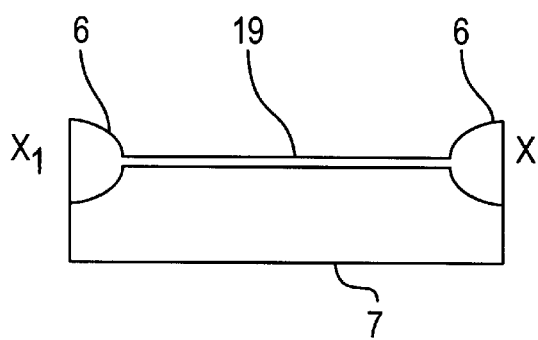
FIGS. 8(a)–(d), 9(a)–(d), and 10((a)–(b) are cross sections for explaining sequentially each of steps of a manufacturing method of (FIG. 2(b))
Figure 8B:
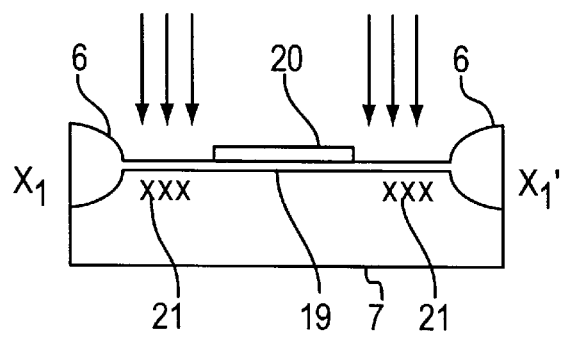
Figure 8C:
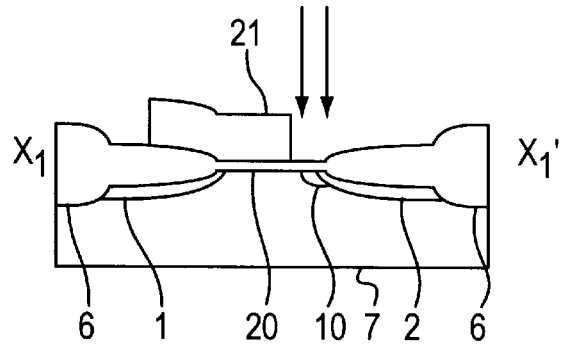
Figure 8D:
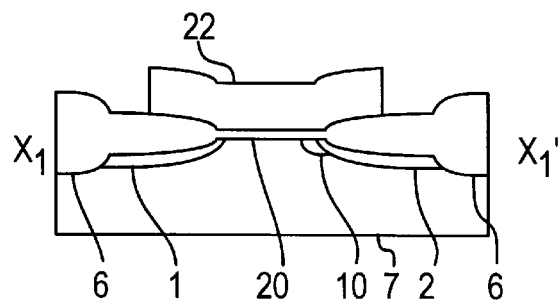
Figure 9:
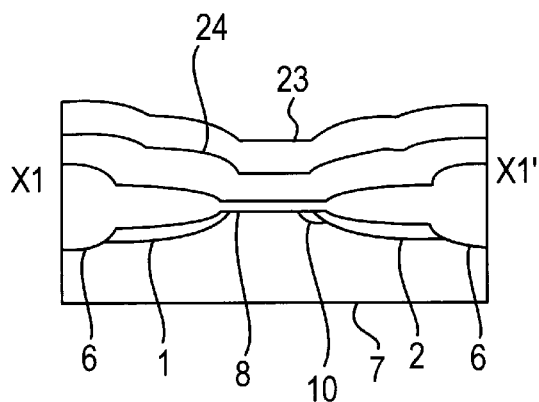
Figure 9:
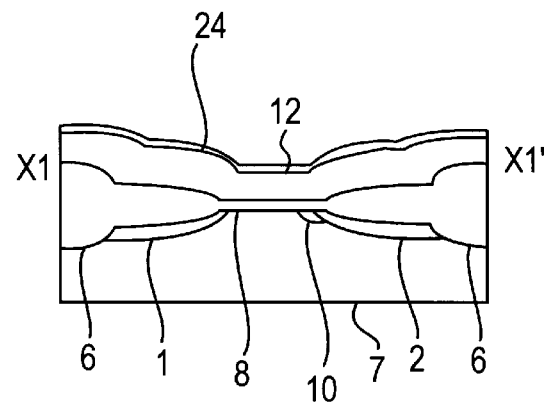
Figure 9:
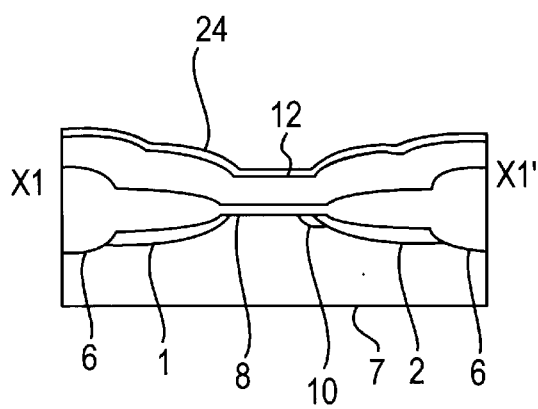
Figure 9:
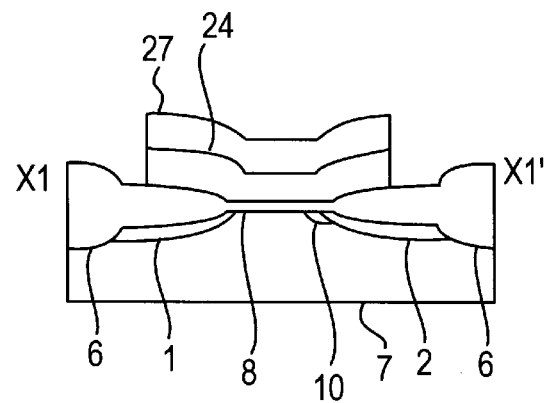
Figure 10:
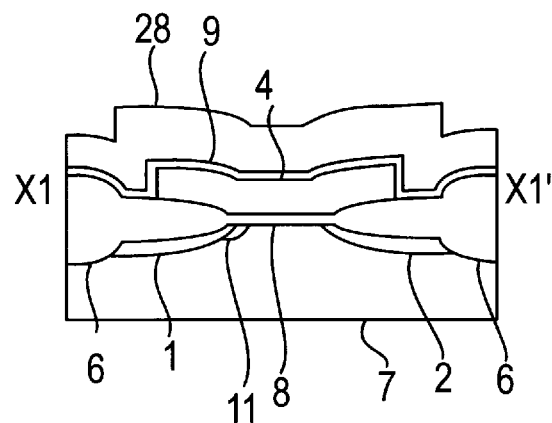
Figure 10:
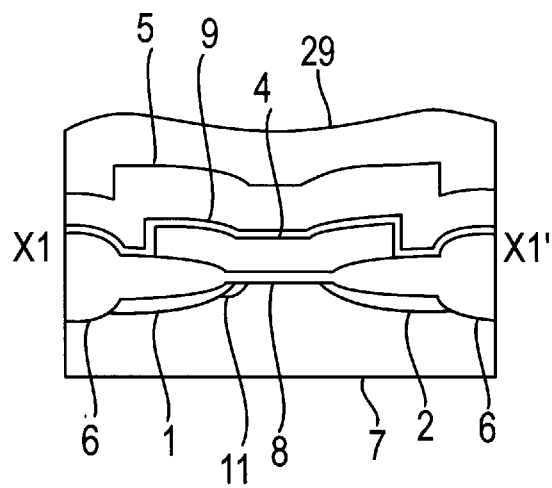
Figure 11A:
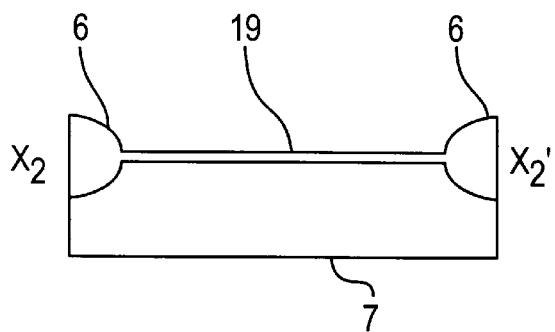
FIGS. 11(a)–(d), 12(a)–(d); and 13(a)–(b) are cross sections for explaining sequentially each of steps of a manufacturing method of the embodiment (FIG. 2(c))
Figure 11B:
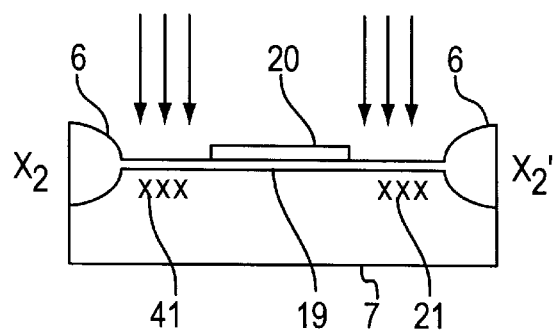
Figure 11C:
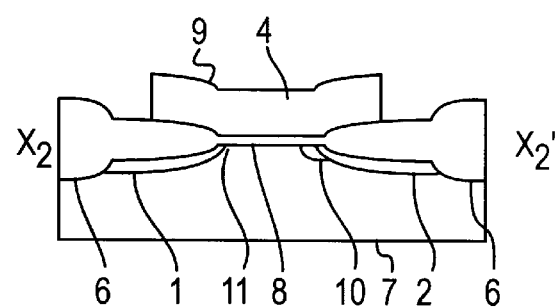
Figure 11D:
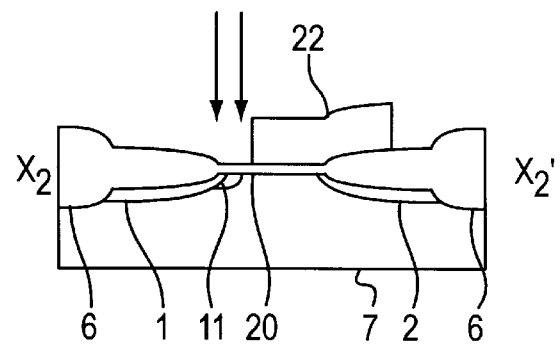
Figure 12:
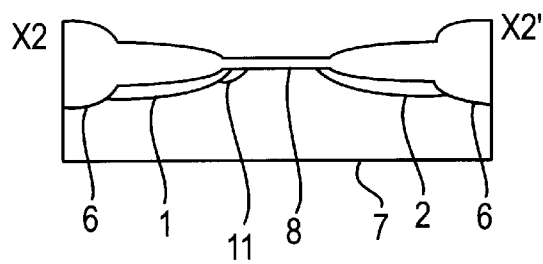
Figure 12:
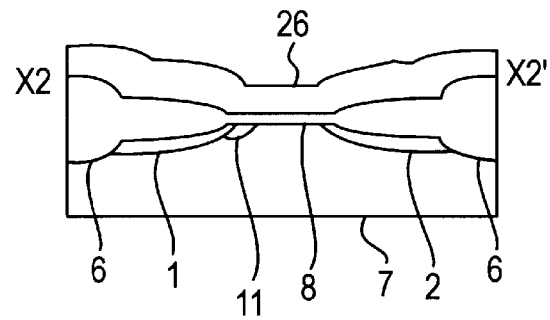
Figure 12:
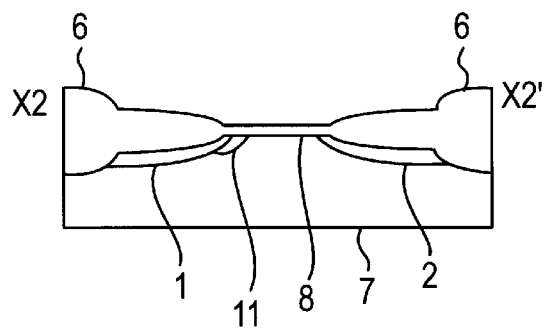
Figure 12:
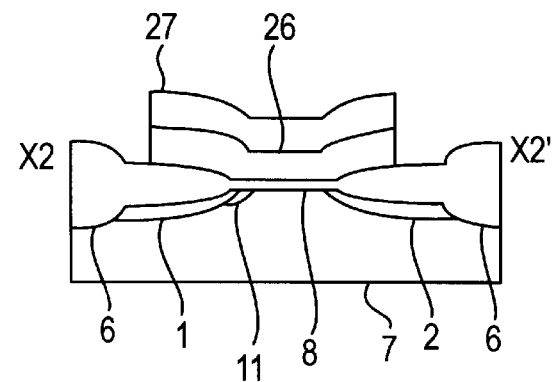
Figure 13:
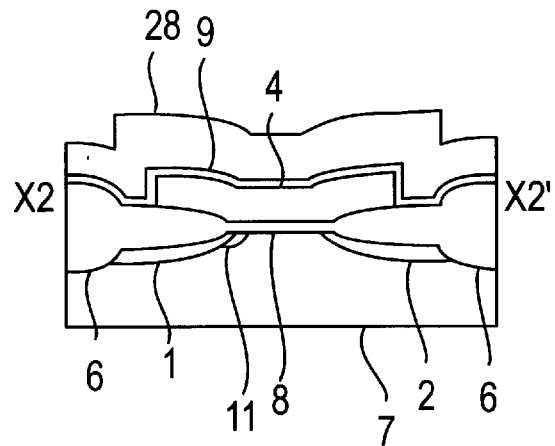
Figure 13:
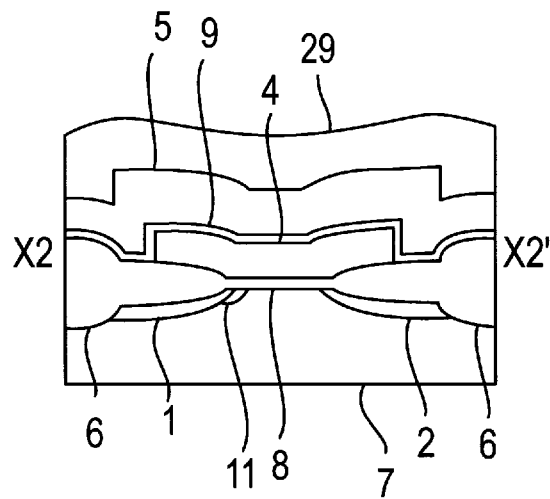
Figure 14A:
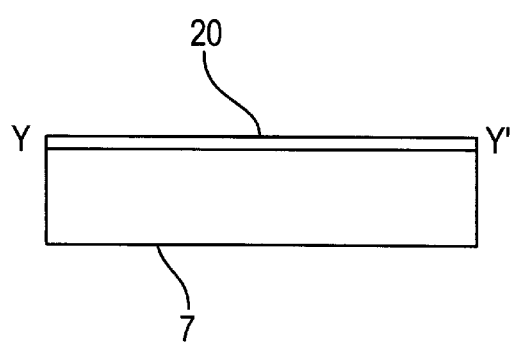
FIGS. 14(a)–(d), 15(a)–(d), and 16(a)–(b) are cross sections for explaining sequentially each of steps of a manufacturing method of the embodiment (FIG. 2(d))
Figure 14B:
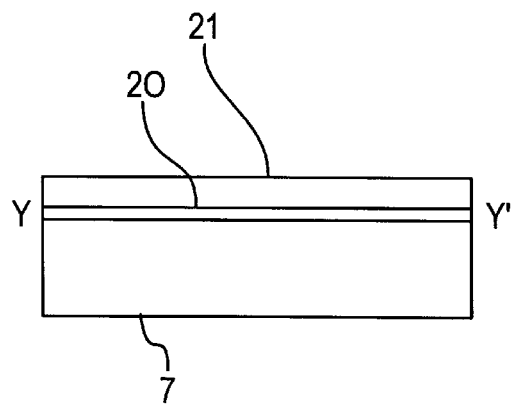
Figure 14C:
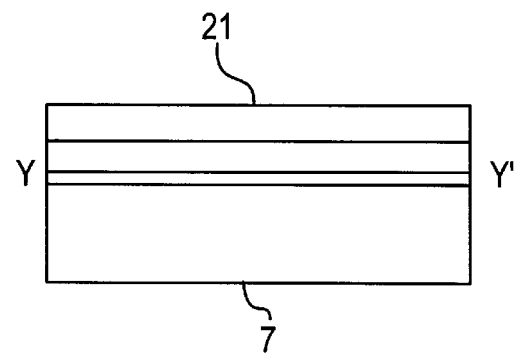
Figure 14D:
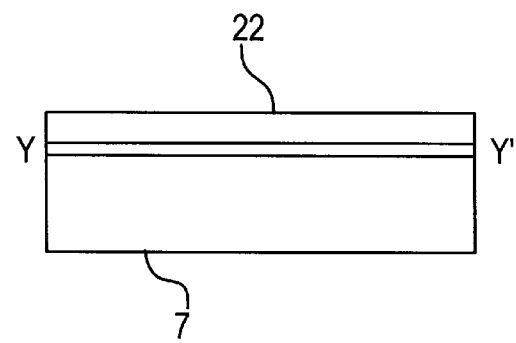
Figure 15:
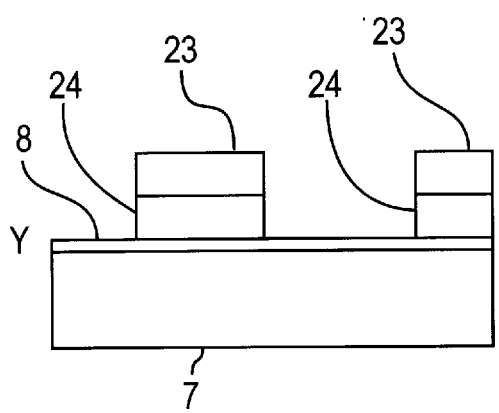
Figure 15:
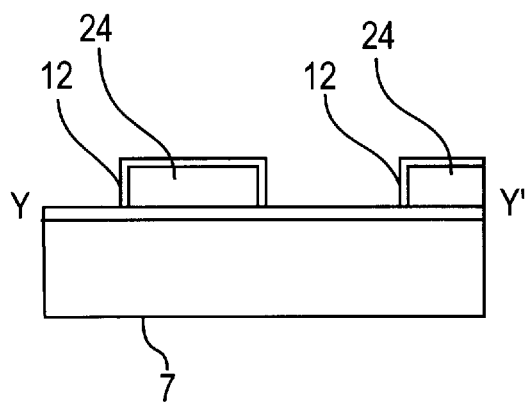
Figure 15:
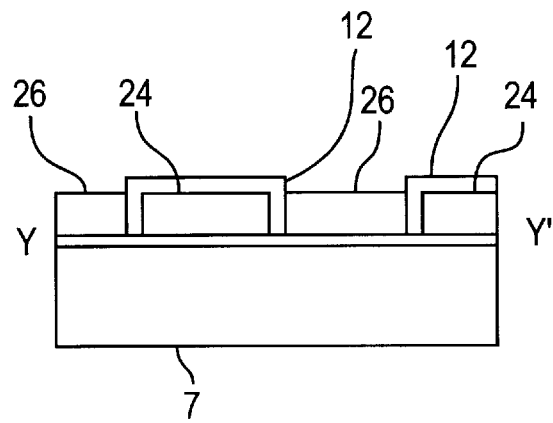
Figure 15:
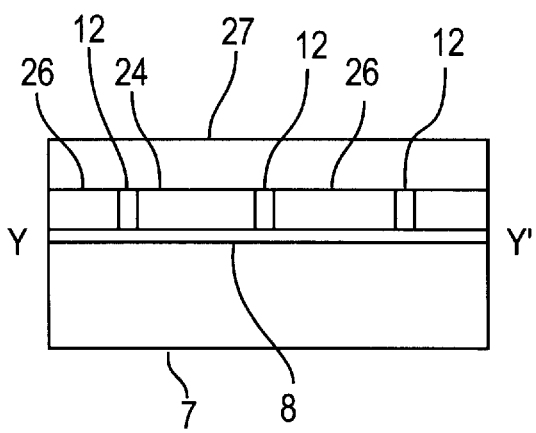
Figure 16:
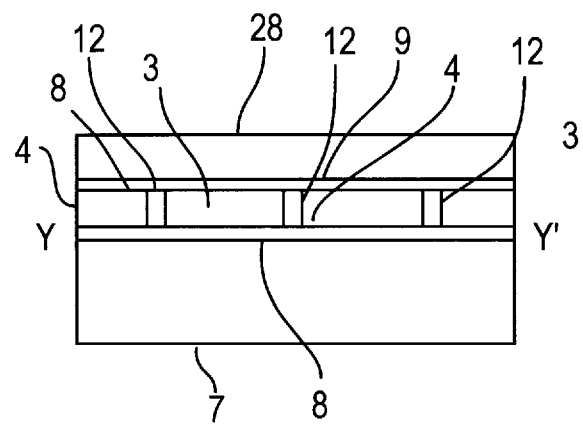
Figure 16:
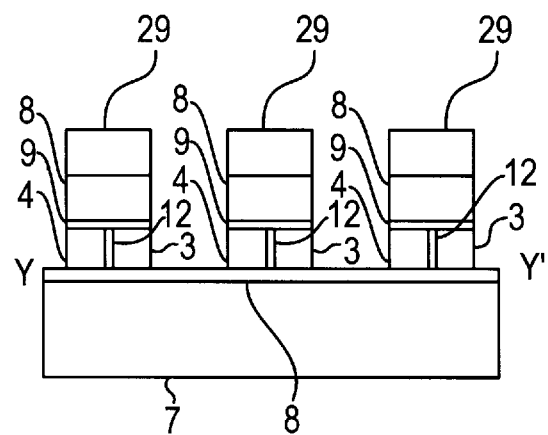

The quantity of the electrons injected in the floating gate at the erasing state is not always zero. It is assumed that the quantities of the stored electrons at the data erasing and data writing in the first floating gate are called $Q_{1L}$ and $Q_{1H}$ respectively. Furthermore, it is assumed that the quantities of the stored electrons at the data erasing and data writing in the second floating gate are called $Q_{2L}$ and $Q_{2H}$, respectively. Still furthermore, it is assumed that the drain currents corresponding to the quantities of the stored electrons $Q_{1L}$, $Q_{1H}$, $Q_{2L}$, and $Q_{2H}$ are called $I_{1L}$, $I_{1H}$, $I_{2L}$, and $I_{2H}$. When the reading out voltage is applied, the drain current can be one of four values depending on the storing of the electrons in the first and second floating gates. However, by the combinations of the structure of the memory device and the quality of the injected electrons, if the equations $I_{1L}=I_{2L}$ and $I_{1H}=I_{2H}$ are established, the equation $I_{1L}+I_{2H}=I_{1H}+I_{2L}$ is satisfied. Thus, the drain current can be only one of three kind values. Therefore, it is required to adjust the structure of the memory device or the quantity of the injected electrons in order that at least one of the inequalities $I_{1L} \neq I_{2L}$ and $I_{1H} \neq I_{2L}$ is satisfied. An example the relation between the quantity of the stored electrons in each of the floating gates and the currents flowing through all of the channels is shown in FIG. 4(c).

At this time, if the values of $I_{1L}$, $I_{1H}$, $I_{2L}$, and $I_{2H}$ is set so that $I_{1L}+I_{2L}$, $I_{1H}+I_{2L}$, $I_{1L}+I_{2H}$, and $I_{1H}+I_{2H}$ are at regular intervals, discriminations of the states becomes preferably easier. For example, by selecting the quantities of the electrons $Q_{1L}$, $Q_{2L}$, $Q_{1H}$, and $Q_{2H}$ so that the proportional equation $I_{1L}: I_{2L}:I_{1H}:I_{2H}=2:2:0:1$ is satisfied, the current ratio flowing in each of the four kinds of states become at regular intervals such as $(I_{1L}+I_{2L}):(I_{1L}+I_{2H}):(I_{1H}+I_{2L}):(I_{1H}+I_{2H})=4:3:2:1$. Discriminations of four states using a sense amplifier become easier.

An erasing operation is performed according to the following procedures. Specifically, for example, a high negative voltage is applied to the control gate, and the semiconductor substrate is made a ground potential. Thus, the electrons stored in the first and second floating gates are extracted to the semiconductor substrate through the first insulating film utilizing a Fouler-Nordheim Current Mechanism.

Subsequently, a manufacturing method of a semiconductor memory device of a first embodiment of the present invention will be described with reference to FIG. 5(a) to FIG. 16(b).

First, as shown in FIG. 5(a), FIG. 8(a), FIG. 11(a), and FIG. 14(a), an element isolation film 6 of for example, 400 nm thick is formed in an element isolation region located on a surface of a P type semiconductor substrate 7 using the known LOCOS method. Subsequently, as shown in FIG. 5(b), FIG. 8(b), FIG. 11(b), and FIG. 14(b), a silicon nitride film is formed on the entire surface of the resultant structure. Thereafter, the silicon nitride film other than the region for forming a channel is removed using the known technique, and a silicon nitride film mask 20 is formed. Further, an N type impurity region 41 is formed by injecting N type impurities, for example, arsenic above from the silicon nitride film mask 20. Thereafter, the impurities are activated by a thermal treatment using for example, nitrogen atmosphere, so that a source 1 and a drain 2 are formed. Subsequently, as shown in FIG. 5(c), FIG. 8(c), FIG. 11(c), and FIG. 14(c), the surfaces of the source 1 and the drain 2 are thermally oxidized at for example, dry oxygen atmosphere, thereby forming a fourth insulating film 13 of for example, 100 nm thick. Further, P type impurities, for example, boron, are introduced selectively near the drain 2 below the second floating gate 4 using a resist mask 21 as a mask by means of the known ion injection method.

Subsequently, as shown in FIG. 5(d), FIG. 8(d), FIG. 11(d), and FIG. 14(d), P type impurities, for example, boron, are selectively introduced near the drain below the second floating gate using a resist mask 22 as a mask by means of the known ion injection method.

Subsequently, as shown in FIG. 6(a), FIG. 9(a), FIG. 12(a), and FIG. 15(a), using a chemical vapor phase growth method, a polycrystalline silicon film 24 is formed on the entire surface of the resultant structure at a temperature of 650 C. Further, to reduce an electric resistivity of the polycrystalline silicon film 24, phosphorus is introduced at a concentration of $5\times10^{15}$ cm$^{-2}$ using the ion injection method for example. Thereafter, the poly-crystalline silicon film 24 is partially removed using a resist mask as a mask by means of an isotropic etching method. The region where the polycrystalline silicon film 24 is left has a belt shape extending perpendicular to the source 1 and the drain 2, as shown in FIG. 6(a), and the uppermost portion of this region is located at the center of the memory cell and the lowermost portion thereof is located at the center of the adjacent memory cell. Specifically, finally, the region for forming the second floating gate 4 is left, as well as the polycrystalline silicon film 24 on a separation region between two memory cells which face the second floating gate 4.

Subsequently, as shown in FIG. 6(b), FIG. 9(b), FIG. 12(b), and FIG. 15(b), the resist mask is removed. The first insulating film exposed is once removed by fluoric acid and the like, because it would be possible that the first insulating film is damaged by the anisotropic etching used for the removal of the polycrystalline silicon film 24 and its reliability is lowered. A silicon oxide film of 8 nm thick is formed again by a thermal oxidation method, and it is used as a first insulating film 8 located below the second floating gate. At the same time, the surface of the polycrystalline silicon film 24 is also oxidized so that a third insulating film 12 is formed. Since an oxidation speed of the polycrystalline silicon film is larger than that of a silicon crystal, the third insulating film is thicker than the first insulating film. Therefore, the first and second floating gates 3 and 4 can be electrically and sufficiently separated from each other within a range of operation conditions of the memory device.

The thickness of the third insulating film 12 greatly depends on the growth condition of the polycrystalline silicon film and the quantity of the introduced impurities. According to the conditions of this embodiment, for example, a silicon oxide film of at least 25 nm thick is formed as the third insulating film.

Subsequently, as shown in FIG. 6(c), FIG. 9(c), FIG. 12(c), and FIG. 15(c), after a polycrystalline silicon film is formed on the entire surface of the resultant structure using a chemical vapor growth method, the polycrystalline silicon film is etched-back using an isotropic etching, thereby burying a portion between the polycrystalline silicon films with the polycrystalline silicon film 26. Furthermore, to reduce an electric resistivity of the polycrystalline silicon film 26, after the surface of the polycrystalline silicon film 26 is oxidized by a thermal oxidizing method, for example, phosphorus is introduced using an ion injection method.

Subsequently, as show in FIG. 6(d), FIG. 9(d), FIG. 12(d), and FIG. 15(d), a mask is formed on the surfaces of polycrystalline silicon films 24 and 26. The polycrystalline silicon films 24 and 26 on the element separation film and the polycrystalline silicon films 24 and 26 on the fourth insulating film are partially removed using an anisotropic etching method.

Subsequently, as shown in FIG. 7(a), FIG. 10(a), FIG. 13(a), and FIG. 16(a), a complex film composed of a silicon nitride film of 8 nm thick and a silicon oxide film of 8 nm thick, formed, on the entire surface of the resultant structure, by for example, a chemical vapor phase growth method is formed, as a second insulating film 9. Subsequently, as a control gate, a polycrystalline silicon film 28 of for example, 200 nm thick is formed using the chemical vapor phase growth method. Thereafter, to reduce an electric resistivity of the polycrystalline silicon film 28, the polycrystalline silicon film 28 is subjected to a thermal treatment at the atmosphere of oxychloride phosphorus at a temperature 850 C. so that phosphorus is introduced thereto.

Figure 2:
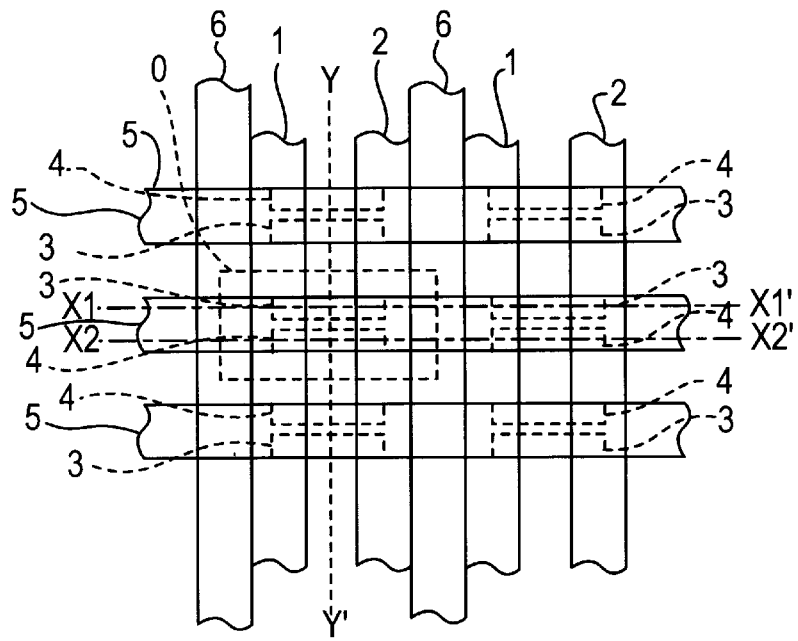
FIG. 2(a) is a plan view for explaining a structure of an embodiment of a non-volatile semiconductor memory device of a present invention.
FIG. 2(b) is a section view taken along the line $X_1$–$X_1$' of FIG. 2(a)
FIG. 2(c) is a section view taken along the line $X_2$–$X_2$' of FIG. 2(a)
FIG. 2(d) is a section view taken along the line Y–Y' of FIG. 2(a)
Figure 2:
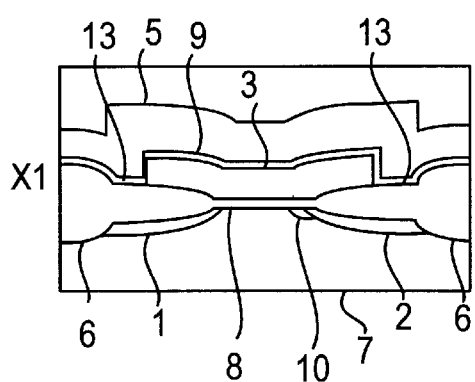
Figure 2:
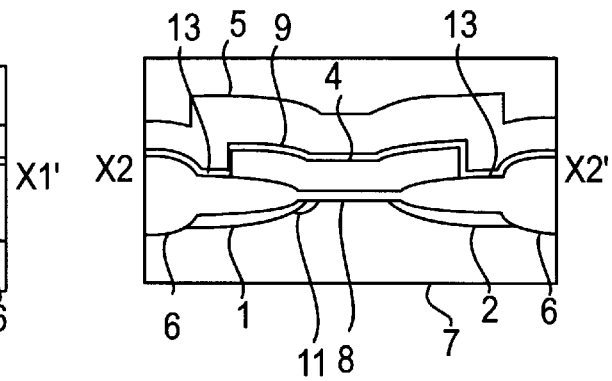
Figure 2:
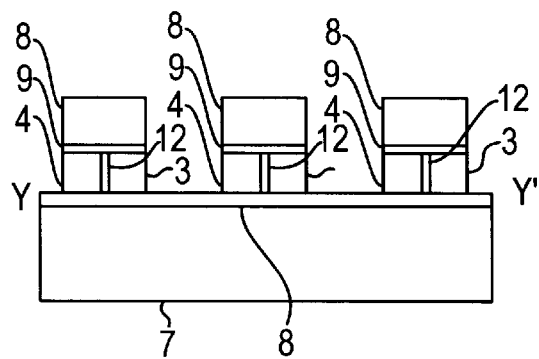

Subsequently, as shown in FIG. 7(b) FIG. 10(b), FIG. 13(b), and FIG. 16(b), three polycrystalline silicon films 24, 26, and 28 are processed so as to be a desired shape using a resist 29 as a mask by means of an anisotropic etching, thereby forming first and second floating gates 3 and 4 and a control gate 5. Thus, the structure shown in FIG. 2 is obtained.

Figure 17A:
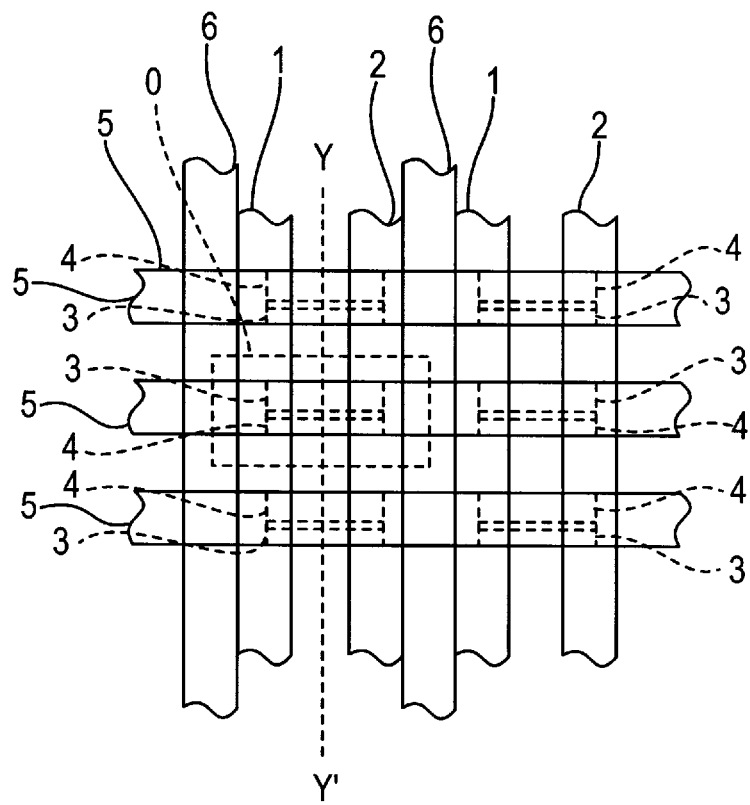
FIG. 17(a) is a plan view for explaining a structure of a second embodiment of the present invention.
Figure 17B:
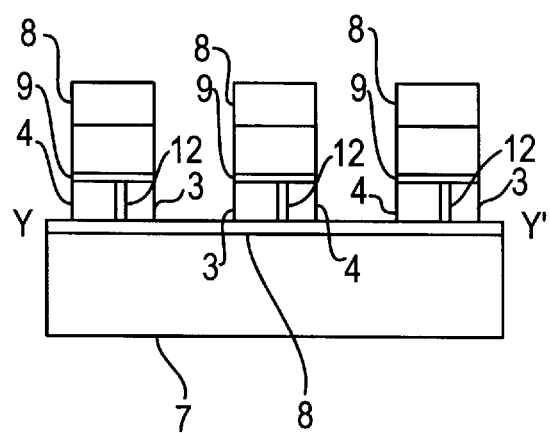
FIG. 17(b) is a cross section taken along the line Y–Y' of FIG. 17(a)

FIG. 17(a) is a plan view for explaining a structure of a second embodiment of the present invention, and FIG. 17(b) is a section view taken along the line Y–Y' of FIG. 17(a).

Figure 18A:
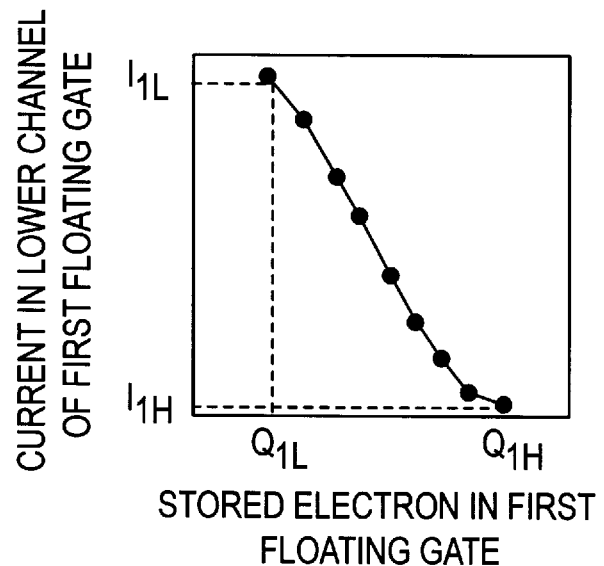
FIG. 18(a) and FIG. 18(b) are graphs showing relations between electrons stored in a control gate and a current flowing through each of channels.
Figure 18B:
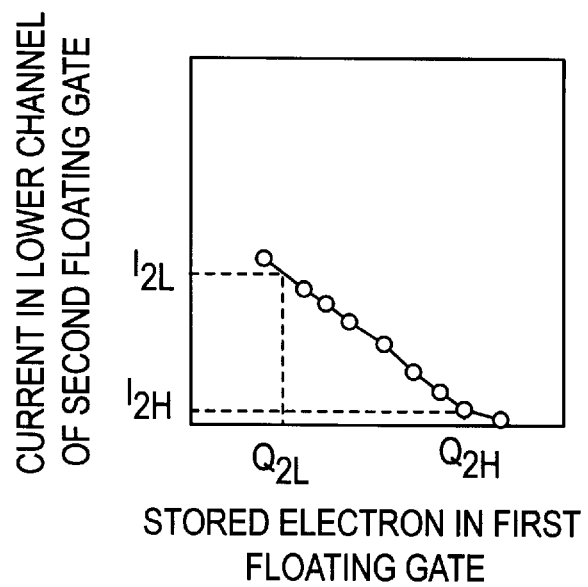

FIG. 18(a) and FIG. 18(b) are graphs showing relations between electrons stored in a control gate and a current flowing through each of channels, FIG. 18(a) is the graph concerning a first floating gate, and FIG. 18(b) is the graph concerning a second floating gate.

As shown in FIGS. 17(a) and 17(b), the structure of the second embodiment of the present invention differs in the widths of the first and second floating gates 3 and 4.

FIGS. 18(a) and 18(b) show an example of an operation of the second embodiment of the present invention. Specifically, FIG. 18(a) shows the relation between the surface density of the electrons stored on the first floating gate and the current flowing through the channel below the first floating gate in the reading operation. FIG. 18(b) shows the relation between the surface density of the electrons stored on the first floating gate and the current flowing through the channel below the second floating gate in the reading operation. Because of the difference of the widths of the first and second floating gates, the quantities of the currents flowing through the channels are different from each other. On the other hand, in the writing operation, when the electrons are injected to the first and second floating gates, respectively, if the same bias condition and the same writing time are used, the electrons having the same surface density can be injected to the first and second floating gates. Therefore, this embodiment has an advantage that the four kinds of the states are expressed writing the data by using the same conditions without the writing conditions to the first and second floating gates. At this time, as shown in FIGS. 18(a) and 18(b), if the state in which $I_{1L}:I_{2L}:I_{1H}:I_{2H}=2:1:0:0$ is satisfied, the ratio of the currents flowing in each of the four kinds of the states is at regular intervals as shown by $(I_{1L}+I_{2L}):(I_{1L}+I_{2H}):(I_{1H}+I_{2L}):(I_{1H}+I_{2H})=3:2:1:0$. Thus, the discrimination of the four kinds of the states are possible by a sense amplifier.

As described above, the present invention is able to provide a non-volatile semiconductor memory device in which a memory cell comprises two floating gates having a minimum dimension below one control gate, and each of the floating gates is able to express two states. In the non-volatile semiconductor memory device of the present invention, an integration density can be increased compared to the conventional non-volatile semiconductor memory device by adopting the structure that four kinds of states can be expressed with one memory cell.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A non-volatile semiconductor memory device comprising:
    a semiconductor substrate having a major surface of p type;
    a drain region of N type and a source region of N type, said drain region and said source region each formed in said major surface of said semiconductor substrate;
    a channel region formed between said drain region and said source region;
    a first insulating film on an upper surface on said channel region, and a second insulating film;
    at least a first and a second floating gate, wherein under surface of said first and second floating gates contact said first insulating film, and wherein upper surfaces of said first and second floating gates contact said second insulating film; and
    a high impurity region located at a position where said channel region contacts one of said drain region and said source region and contacting said one of said drain region and said source region, said high impurity region being located under one of said first and said second floating gates and having an impurity concentration greater than said channel region,
    wherein each of said at least a first and a second floating gate is capable of storing one of two data states in accordance with charge stored on each of said floating gates.

2. The non-volatile semiconductor memory device according to claim 1, wherein a third insulating film electrically separates said first floating gate from said second floating gate.

3. The non-volatile memory according to claim 2, wherein said third insulating film is located so that said channel forms a first and a second channel between said drain region and said source region, said first channel being formed in a surface of said semiconductor substrate below said first floating gate and said second channel being formed in a surface of said semiconductor substrate below said second floating gate.

4. The non-volatile memory according to claim 1, wherein a third insulating film located so that said channel forms a first and a second channel between said drain region and said source region, said first channel being located in a surface of said semiconductor substrate below said first floating gate and said second channel located in a surface of said semiconductor substrate below said second floating gate.

5. A non-volatile memory according to claim 1, further comprising a second high impurity region located at a position where said channel region contacts the other of said drain region and said source region and contacting said other of said drain region and said source region, said second high impurity region being located under the other of said first and said second floating gates and having an impurity concentration greater than said channel region.

6. A method of writing data to the non-volatile memory according to claim 5, comprising the steps of:
    producing a high electric field region at a position where one of said drain region and said said source region contacts said high impurity region under said one of said first and said second floating gate, and
    subsequently producing a high electric field region at a position where the other of said drain region and said source region contacts said second high impurity region under the other of said first and said second floating gate.

7. A method of reading out data from the non-volatile memory according to claim 1, comprising the steps of:
    applying a positive voltage to said drain and to one of said first and said second floating gates;
    measuring current flowing through said channel between said source and said drain.

8. A method of reading out data from the non-volatile memory according to claim 4, comprising the steps of:
    applying a positive voltage to said drain and to said first floating gate;

measuring current flowing through said first channel between said source and said drain below said first floating gate.

9. A method of reading out data from the non-volatile memory according to claim 4, comprising the steps of:

applying a positive voltage to said drain and to said second floating gate;

measuring current flowing through said second channel between said source and said drain below said second floating gate.

10. A method of writing data to a non-volatile memory having first and second high impurity regions formed in a semiconductor substrate having a drain region and a source region formed in a major surface thereof, and a channel region formed between said drain region and said source region, said first and said second high impurity regions having impurity concentrations higher than said semiconductor substrate, said first high impurity region being located at a position below a first floating gate where said channel region contacts one of said drain region and said source region and said second high impurity region located at a position below a second floating gate where said channel region contacts the other of said drain region and said source region, said first floating gate being electrically separated from said second floating gate, said method comprising the steps of:

producing a high electric field region at said first high impurity region below said first floating gate for storing charge on said first floating gate, and subsequently producing a high electric field region at said second high impurity region below said second floating gate for storing charge on said second floating gate.

* * * * *